United States Patent
Uraki

(10) Patent No.: US 8,235,507 B2
(45) Date of Patent: *Aug. 7, 2012

(54) LIQUID DROPLET EJECTION HEAD

(75) Inventor: Shingo Uraki, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 202 days.

This patent is subject to a terminal disclaimer.

(21) Appl. No.: 12/745,902

(22) PCT Filed: Nov. 6, 2008

(86) PCT No.: PCT/JP2008/070186
§ 371 (c)(1),
(2), (4) Date: Jun. 3, 2010

(87) PCT Pub. No.: WO2009/072370
PCT Pub. Date: Jun. 11, 2009

(65) Prior Publication Data
US 2010/0245493 A1 Sep. 30, 2010

(30) Foreign Application Priority Data
Dec. 6, 2007 (JP) .................................. 2007-315731

(51) Int. Cl.
*B41J 2/045* (2006.01)
(52) U.S. Cl. ................. 347/68; 347/71; 347/72
(58) Field of Classification Search ............... 347/68–72; 310/311, 330; 252/62.9
See application file for complete search history.

(56) References Cited

U.S. PATENT DOCUMENTS

| 2009/0066738 A1* | 3/2009 | Seto ................................ 347/10 |
| 2010/0264354 A1* | 10/2010 | Uraki et al. ............ 252/62.9 PZ |

FOREIGN PATENT DOCUMENTS

| JP | 2001240471 | 9/2001 |
| JP | 2004345886 | 12/2004 |
| JP | 2005008516 | 1/2005 |
| JP | 2006205572 | 8/2006 |
| JP | 200755867 | 3/2007 |
| JP | 2007-145650 | * 6/2007 |
| JP | 2007145650 | 6/2007 |

OTHER PUBLICATIONS

Properties of (Na,K)NbO3 and (Li, Na, K)NbO3 Ceramic Mixed Systems, Chu et al., Dep. of EE, Cheng Kung University, Dep. of Natural Scince, Tainan Teachers College, Tainan, Taiwan, Ferroelectrics, 287:23-33,2003.*

* cited by examiner

*Primary Examiner* — Matthew Luu
*Assistant Examiner* — Henok Legesse
(74) *Attorney, Agent, or Firm* — Lucas & Mercanti, LLP

(57) ABSTRACT

A droplet ejection head provided with a piezoelectric actuator made by using a $KNbO_3$—$NaNbO_3$ piezoelectric porcelain composition which exhibits a larger piezoelectric constant than those of conventional ones and does not have any secondary phase transition point in the neighborhood of room temperature (from 10 to 40° C.) and which is suitable for use in the piezoelectric actuator of a droplet ejection head, that is, a droplet ejection head characterized by being provided with a piezoelectric actuator made by using a piezoelectric porcelain composition represented by the general formula: $(1-y-z-w)(K_xNa_{1-x})NbO_3+yLiNbO_3+zSrTiO_3+wBiFeO_3$, wherein $(K_xNa_{1-x})NbO_3$ represents potassium sodium niobate; $LiNbO_3$ represents lithium niobate; $SrTiO_3$ represents strontium titanate; and $BiFeO_3$ represents bismuth ferrate; with the proviso that $0.4<x<0.6$, $0<y\leq0.1$, $0<z<0.1$, $0<w<0.09$, and $0.03<y+z+w\leq0.12$.

5 Claims, 5 Drawing Sheets

LIQUID DROPLET EJECTION HEAD

CROSS REFERENCE TO RELATED APPLICATION

This is a U.S. National Phase Application under 35 U.S.C. 371 of International Application PCT/JP2008/070186, filed Nov. 6, 2008, which claims the priority of Japanese Application No. 2007-315731, filed Dec. 6, 2007, the entire content of both Applications are hereby incorporated by reference.

TECHNICAL FIELD

The present invention relates to a liquid droplet ejection head.

BACKGROUND

In the past, it has been used a PZT ($PbTiO_3$—$PbZrO_3$) component-based ceramic containing lead as a piezoelectric ceramic composition. The reason for it is that the aforesaid PZT exhibits excellent piezoelectric properties and a high mechanical quality factor, and it is easy to produce materials exhibiting various desired characteristics which are required for various applications such as a sensor, an actuator, and a filter. Further, since the PZT has a high relative dielectric constant, it may also be used as a capacitor.

However, while the piezoelectric ceramic composition composed of the aforesaid PZT exhibits excellent characteristics, it contains lead as an element constituting the composition, leading to a concern that harmful lead may be eluted from industrial waste of products containing PZT to result in an environmental pollution. The increasing awareness of environmental concern in recent years has made it difficult to manufacture the products containing substances such as PZT which may be a cause of environmental pollution.

In order to resolve the above-described problem caused by the inclusion of lead as a component, there has been required a new piezoelectric ceramic composition containing no lead. In this situation, a piezoelectric ceramic composition having $KNbO_3$—$NaNbO_3$ as a main composition has been paid attention since it contains no lead and exhibits excellent piezoelectric properties.

However, although the above-described piezoelectric ceramic composition having $KNbO_3$—$NaNbO_3$ as a main composition exhibits a high Curie temperature (the first order phase transition) such as about 200° C. or higher, there exists the second order phase transition which is formed by a phase change from a ferroelectric phase at a lower temperature to a ferroelectric phase at a higher temperature in the temperature range of near room temperature. As a result, there is a possibility that degradation of properties may occur to produce a problem for practical use when the temperature cycle passes through the second order phase transition. Therefore, many technologies were proposed to decrease the temperature of the second order phase transition to be below the room temperature.

In Patent document 1, there was disclosed a piezoelectric ceramic composition containing potassium sodium lithium niobate, strontium titanate and bismuth iron oxide and represented by the formula of $(1-a-b)(K_xNa_yLi_{1-x-y})NbO_3+aSrTiO_3+bBiFeO_3$, $0<a\leq0.1$, $0<b\leq0.1$, $0<x\leq0.18$, $0.8<y<1$, provided that potassium sodium lithium niobate is $(K_xNa_yLi_{1-x-y})NbO_3$, strontium titanate is $SrTiO_3$, and bismuth iron oxide is $BiFeO_3$.

According to Patent document 1, the piezoelectric ceramic composition composed of potassium sodium lithium niobate as a maim component can be controlled as follows. The composition of which is made rich in Na and strontium titanate is incorporated in an appropriate amount in the compound, and further an appropriate amount of rhombohedral crystal $BiFeO_3$ is include in the compound to become Curie temperature of about 870° C. As a result of multiple solid solute of different crystals to $(NaKLi)NbO_3$, the phase transition temperature can be changed, thereby it can be decreased the temperature change of elastic constant and the discontinuously changing portion of piezoelectric $d_{33}$ constant at around room temperature.

In Patent document 2, it was disclosed a piezoelectric ceramic composition made of a perovskite compound which is composed of Na, K, Li, Sr, Nb, and Ti as a main component, in which the formula in molar ratio is represented as: $(1-x-y)KNbO_3+xNaNbO_3+y(LiNbO_3+SrTiO_3)$, provided that x and y satisfy $0.42\leq x\leq 0.50$, $0.06\leq y\leq 0.12$.

According to Patent document 2, it is possible to decrease the second order phase transition temperature of the aforesaid piezoelectric ceramic composition to be below the room temperature. This can be achieved with the 4 component composition which was made by substituting a part of the composition of the 2 component piezoelectric ceramic composition mainly composed of $KNbO_3$—$NaNbO_3$ with $LiNbO_3$ and $SrTiO_3$ at the same time.

Patent document 1: JP-A No. 2007-145650
Patent document 2: JP-A No. 2007-55867

DISCLOSURE OF THE INVENTION

Problem to be Solved by the Invention

However, the piezoelectric ceramic composition mainly composed of $KNbO_3$—$NaNbO_3$ which had been reported in the past was not practically used widely compared with lead titanate zirconate and lead titanate. This is because it has only a small amount of piezoelectric constant as a piezoelectric $d_{33}$ constant, which is an important property for a material used for a piezoelectric actuator to be employed in a liquid droplet ejection head. In Patent document 1, it was reported to be about 74 (pC/N) or less, and in Patent document 2, it was reported to be about 112 (pC/N) or less.

The present invention has been achieved in consideration of such problem. An object of the present invention is to provide a liquid droplet ejection head provided with a piezoelectric actuator using a $KNbO_3$—$NaNbO_3$ piezoelectric ceramic composition which is suitable for that purpose. The aforesaid $KNbO_3$—$NaNbO_3$ piezoelectric ceramic composition exhibits a higher piezoelectric constant than conventionally known $KNbO_3$—$NaNbO_3$ piezoelectric ceramic composition and does not have a second order phase transition at around room temperature (from 10° C. to 40° C.).

Means to Solve the Problem

The above-mentioned object of the present invention can be attained by the following compositions.
1. A liquid droplet ejection head comprising a piezoelectric actuator using a piezoelectric ceramic composition represented by the following formula:

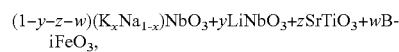

$$(1-y-z-w)(K_xNa_{1-x})NbO_3+yLiNbO_3+zSrTiO_3+wBiFeO_3,$$

provided that $0.4<x<0.6$, $0<y\leq0.1$, $0<z<0.1$, $0<w<0.09$, and $0.03<y+z+w\leq0.12$, wherein $(K_xNa_{1-x})NbO_3$ represents potassium sodium niobate, $LiNbO_3$ represents lithium niobate, $SrTiO_3$ represents strontium titanate and $BiFeO_3$ represents bismuth iron oxide.

2. The liquid droplet ejection head of the above-described item 1,
wherein a piezoelectric $d_{33}$ constant is 120 (pC/N) or more.

3. The liquid droplet ejection head of the above-described item 1,
wherein the piezoelectric actuator is a shear mode piezoelectric actuator utilizing a piezoelectric $d_{15}$ constant.

4. The liquid droplet ejection head of the above-described item 1,
wherein the piezoelectric actuator is a deflection piezoelectric actuator utilizing a piezoelectric $d_{31}$ constant.

5. The liquid droplet ejection head of the above-described item 1,
wherein the piezoelectric actuator is a push piezoelectric actuator utilizing a piezoelectric $d_{31}$ constant.

6. The liquid droplet ejection head of the above-described items 1 or 2,
wherein the piezoelectric actuator is a push piezoelectric actuator utilizing a piezoelectric $d_{33}$ constant.

Effects of the Invention

According to the present invention, it is possible to provide a liquid droplet ejection head provided with a piezoelectric actuator using a $KNbO_3$—$NaNbO_3$ piezoelectric ceramic composition which is suitable for use as a piezoelectric actuator in a liquid droplet ejection head. The aforesaid $KNbO_3$—$NaNbO_3$ piezoelectric ceramic composition exhibits a higher piezoelectric constant than conventionally known $KNbO_3$—$NaNbO_3$ piezoelectric ceramic composition and does not have a second order phase transition at around room temperature (from 10° C. to 40° C.).

PREFERRED EMBODIMENTS TO CARRY OUT THE PRESENT INVENTION

Figure 1:
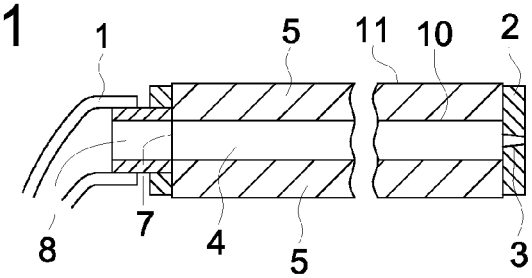
FIG. 1 is a diagram illustrating a constitution of the liquid droplet ejection head of the first embodiment of the present invention.

An embodiment of the liquid droplet ejection head which is provided with the piezoelectric actuator of the present invention will now be described.

The liquid droplet ejection head of the present embodiment is characterized in that it is provided with a piezoelectric actuator using a piezoelectric ceramic composition represented by the following formula:

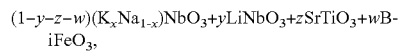

$(1-y-z-w)(K_xNa_{1-x})NbO_3+yLiNbO_3+zSrTiO_3+wBiFeO_3$, provided that $0.4<x<0.6$, $0<y\leq0.1$, $0<z<0.1$, $0<w<0.09$, and $0.03<y+z+w\leq0.12$, wherein $(K_xNa_{1-x})NbO_3$ represents potassium sodium niobate, $LiNbO_3$ represents lithium niobate, $SrTiO_3$ represents strontium titanate and $BiFeO_3$ represents bismuth iron oxide.

First, an embodiment of the piezoelectric ceramic composition of the present invention is described below.

The reasons for defining the above-described range for x, y, z, w, and y+z+w each are as follows.

With respect to x, the reason of limiting as $0.4<x<0.6$ is that: the piezoelectric constant will be remarkably decreased when x is 0.4 or less; and that the sintering property will be extremely deteriorated when x is 0.6 or more.

With respect to y, the reason of limiting as $0<y\leq0.1$ is that: the sintering property will be extremely deteriorated when y is 0, since Li is not contained; and that the piezoelectric constant will be remarkably decreased when y is larger than 0.1.

With respect to z, the reason of limiting as $0<z<0.1$ is that: it cannot be obtained the piezoelectric ceramic composition having no second order phase transition at around room temperature when z is 0, since $SrTiO_3$ is not contained; and that the piezoelectric constant will be remarkably decreased when z is 0.1 or more.

With respect to w, the reason of limiting as $0<w<0.09$ is that: the piezoelectric constant will be remarkably decreased when w is 0, since $BiFeO_3$ is not contained; and that the sintering property will be extremely deteriorated when w is 0.09 or more.

With respect to "y+z+w", the reason of limiting as $0.03<y+z+w\leq0.12$ is that: the sintering property will be extremely deteriorated when "y+z+w" is 0.03 or less; and that the piezoelectric constant will be remarkably decreased when "y+z+w" is larger than 0.12.

Next, a method for producing the piezoelectric ceramic composition of the present embodiment will be described. The method for producing the piezoelectric ceramic composition is not particularly limited, but the production method via a solid phase reaction will be described.

The above-described piezoelectric ceramic composition can be provided by preparing raw materials containing each metal element as the raw materials, and then the materials being sufficiently blended by, for example, a ball mill. As raw materials the followings can be cited: $Li_2CO_3$, $Li_2O$, $LiNO_3$ and LiOH as a Li containing compound; $Na_2CO_3$, $NaHCO_3$ and $NaNO_3$ as a Na containing compound; $K_2CO_3$ and $KNO_3$ as a K containing compound; $Nb_2O_5$, $Nb_2O_3$ and $NbO_2$ as a Nb containing compound; $SiCO_3$ as a Sr containing compound; $TiO_2$ as a Ti containing compound; $Fe_2O_3$ as a Fe containing compound; and $Bi_2O_3$ as a Bi containing compound.

First, the raw materials are prepared and fully dried. The dried raw materials each were measured based on the stoichiometric ratio which satisfies the above-described formula, and they are blended via a ball-mill, then dried. Subsequently, the resulting mixture is calcined at 700 to 900° C. to decompose and solidify the raw materials via a solid phase reaction. The resulting calcined mixture is wet-pulverized into fine particles having a center of the particle size distribution of about 5 μm, and it is dried to produce a calcined powder.

To the obtained calcined powder is added an organic bonding agent such as a binder, which is then granulated and subjected to a pressure molding. The aforesaid pressure molding is preferably carried out in such a manner that the granulated substance made of the above pulverized substance is molded into the form of pellets via uniaxial pressing, and then the resulting pellets are re-molded via, for example, a cold isostatic press (CIP).

The molded material thus obtained is sintered at from 1,000 to 1,200° C. to produce a sintered product of the above-described piezoelectric ceramic composition. The resulted sintered product is cut to a predetermined size, which is then subjected to a parallel grinding, and then is formed electrodes via sputtering on both sides thereof. Subsequently, in silicone oil at about from 80 to 150° C., direct current voltage of from 2 to 7 kV/mm is applied between the electrodes to produce a piezoelectric ceramic composition polarized in the thickness direction.

As describe above, the piezoelectric ceramic composition of the present invention can be achieved based on potassium sodium niobate having a specific composition which is excellent in sintering property and exhibiting high piezoelectric constant. Sintering property can be further improved by partially substituting the composition of the potassium sodium niobate with lithium niobate. Suppressing of the second order phase transition at around room temperature can be achieved by substituting the composition with strontium titanate. Further increasing of the piezoelectric constant can be achieved by substituting the composition with bismuth iron oxide. By carrying out the above-described processes, it can be obtained a $KNbO_3$—$NaNbO_3$ piezoelectric ceramic composition which is suitable for use as a piezoelectric actuator in a liquid droplet ejection head.

The amount of displacement of such a piezoelectric actuator is proportional to the product of the piezoelectric constant and the applied voltage. The liquid droplet ejection head, which allows ejection of liquid, can take various forms by allowing displacement of the piezoelectric actuator, and they will be described below by listing examples of a shear mode type utilizing a piezoelectric $d_{15}$ constant, a deflection type utilizing a piezoelectric $d_{31}$ constant, a push type, and a push type utilizing a piezoelectric $d_{33}$ constant.

Below, the first embodiment of the liquid droplet ejection head of the present invention employing the above piezoelectric ceramic composition as the piezoelectric actuator of the shear mode type utilizing a piezoelectric $d_{15}$ constant is described with reference to FIG. 1 to FIG. 3. FIG. 1 is a diagram illustrating a constitution of the liquid droplet ejection head of the first embodiment of the present invention. FIG. 2 is a diagram illustrating a constitution of the liquid droplet ejection heads having multiple nozzles of the first embodiment of the present invention. FIG. 3 is a diagram illustrating motions of the liquid droplet ejection heads shown in FIG. 1 and FIG. 2.

In the liquid droplet ejection head of the present embodiment, many pressure chambers are arranged, each of which has a nozzle to eject a liquid and is separated by dividing walls. Some or all of the aforesaid dividing walls are constituted of a piezoelectric actuator of the shear mode type, and then, all or some of the surfaces of the dividing walls form an electrode onto which a driving pulse is applied. Application of the driving pulse to the above electrode causes a shear deformation on the above dividing wall, whereby pressure inside the above pressure chamber changes to result in ejection of droplets from the above nozzle which is formed at one end of the above pressure chamber.

In FIG. 1 to FIG. 3, each of numerals from 1 to 11 designates:
1: liquid tube
2: nozzle forming member
3: nozzle
4: pressure chamber
5: piezoelectric dividing wall (being a shear mode piezoelectric actuator)
6: cover plate
7: liquid supply port
8: shared liquid chamber
9: substrate, and
10 and 11: electrodes.

Pressure chamber 4 is formed of piezoelectric dividing wall 5, cover plate 6, and substrate 9.

First, two pieces of the above piezoelectric ceramic composition are prepared, which have been molded in a sheet form and then sintered to allow it to be polarized in the thickness direction. Substrate 9 and the two pieces of piezoelectric ceramic compositions, which are overlaid so that the direction of polarization thereof differ from each other, are pasted together above and below via adhesive 100. Then, the upper part of the laminated compositions is subjected to a cutting process employing a diamond blade in such a manner that all of the plurality of pressure chambers 4, exhibiting a groove-like structure, have the same form and are parallel to each other. Due to the above processing, adjacent pressure chambers 4 are divided by piezoelectric dividing walls 5 (being a shear mode piezoelectric actuator) which are polarized in the direction of the arrows. Then, after electrodes 10 and 11 are formed on piezoelectric dividing walls 5 via a plating method or a vapor-phase deposition method, cover plates 6 are pasted onto the upper surface, followed by nozzle forming members 2 being pasted onto the front surface.

FIG. 1 shows a liquid droplet ejection head exhibiting one unit of the pressure chamber and one piece of nozzle. However, in an actual liquid droplet ejection head, a plurality of pressure chambers 4, which are divided between cover plate 6 and substrate 9 by a plurality of piezoelectric dividing walls, are formed parallel to each other, one end of pressure chamber 4 is connected to nozzle 3, which is formed through nozzle forming member 2, and liquid supply port 7 located at the other end of pressure chamber 4 is connected to a liquid tank (not illustrated) by liquid tube 1 through shared liquid chamber 8. Driving pulse voltage is applied between electrode 10 and grounded electrode 11, both of which are formed to be in tight contact with piezoelectric dividing walls 5.

Figure 2A:
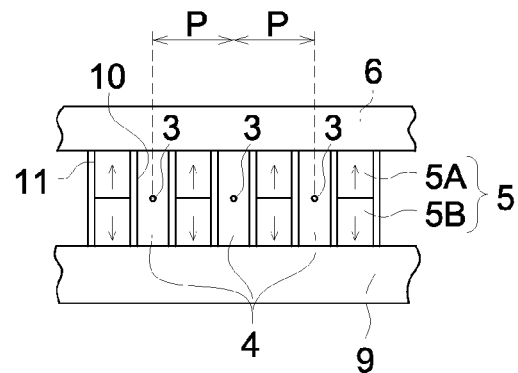
FIG. 2 is a diagram illustrating a constitution of the liquid droplet ejection heads having multi-nozzles of the first embodiment of the present invention.
Figure 2B:
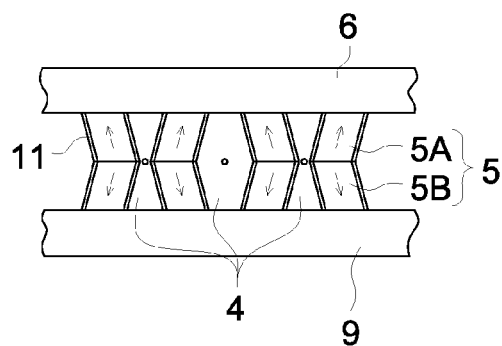
Figure 3:
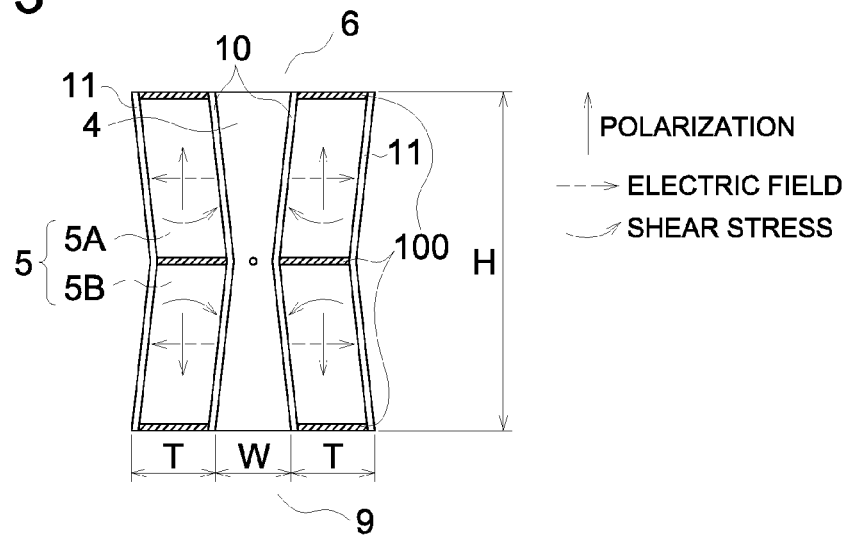
FIG. 3 is a diagram illustrating motions of the liquid droplet ejection heads shown in FIG. 1 and FIG. 2.

In FIG. 2(a), piezoelectric dividing wall 5 is constituted of two piezoelectric dividing walls 5A and 5B (being a shear mode piezoelectric actuator) in which the polarization direction differs from each other as shown by arrows. As shown in FIG. 2(a), when no driving pulse is applied to electrode 10, piezoelectric dividing walls 5A and 5B do not change their shapes. However, as shown in FIG. 2(b) and FIG. 3, when a driving pulse is applied to electrode 10, shear stress occurs due to the electric field in a direction perpendicular to the polarized direction of the piezoelectric dividing wall, which causes shearing strain at the joint surfaces of both piezoelectric dividing walls 5A and 5B. Due to the change of the pressure in pressure chamber 4 caused by the above shearing strain, some of the liquid which fill pressure chamber 4 are ejected via nozzle 3. The average amount of displacement Δ of the piezoelectric dividing wall and generated pressure P, at the time of ejection, are represented by the formulae below.

$$\Delta = (\text{piezoelectric } d_{15} \text{ constant}) \times H \times V/(4T), \text{ and}$$

$$P = (\text{piezoelectric } d_{15} \text{ constant}) \times H \times V/\{2TW(1/B)+(1/S)(dS/dP)\},$$

wherein, as shown in FIG. 3, H is the depth of pressure chamber 4, W is the width of pressure chamber 4, V is a driving pulse voltage, T is the thickness of piezoelectric dividing wall 5, B is a modulus of volume elasticity of the liquid, and S is the cross-sectional area of pressure chamber 4.

Supply of liquid from a liquid tank to a nozzle after droplets have been ejected is carried out through a liquid supply port and pressure chamber 4 by force of capillary action at the nozzle.

Piezoelectric dividing wall 5 in the liquid droplet ejection head employs a piezoelectric ceramic composition represented by the following formula:

$$(1-y-z-w)(K_xNa_{1-x})NbO_3+yLiNbO_3+zSrTiO_3+wBiFeO_3,$$

provided that $0.4<x<0.6$, $0<y\leqq0.1$, $0<z<0.1$, $0<w<0.09$, and $0.03<y+z+w\leqq0.12$, wherein $(K_xNa_{1-x})NbO_3$ represents potassium sodium niobate, $LiNbO_3$ represents lithium niobate, $SrTiO_3$ represents strontium titanate and $BiFeO_3$ represents bismuth iron oxide.

By employing a piezoelectric ceramic composition exhibiting a high piezoelectric $d_{31}$ constant and having no second order phase transition at around room temperature (from 10° C. to 40° C.) such as described in the present embodiments as piezoelectric dividing walls (a shear mode piezoelectric actuator), the followings can be achieved. It is possible to obtain an enough amount of displacement which is required to eject an ink droplet with a driving voltage applicable to practical use. And at the same time, a change of displacement properties of the piezoelectric actuator is small even if temperature change takes place in the using temperature range near room temperature, and liquid ejection properties are stabilized.

Since the above piezoelectric ceramic composition contains no lead in its composition, toxic lead is not eluted off from the wastes thereof. Therefore, the above piezoelectric ceramic composition can be one which contains no lead and exhibits high safety.

The shear mode type piezoelectric actuator utilizing a piezoelectric $d_{15}$ constant employing the above piezoelectric ceramic composition can be applied to a liquid droplet ejection head below as a deformation example of the first embodiment of the liquid droplet ejection head of the present invention.

In the above deformation liquid droplet ejection head, a plurality of pressure chambers provided with nozzles are divided by dividing walls, and the above pressure chambers are formed by above two dividing walls, a wall combining the aforesaid two dividing walls, and a wall in which above nozzle is formed. And at least one of the above combining walls is constituted with the shear mode type piezoelectric actuator, and over the whole or some of the surfaces of the piezoelectric actuator, formed are electrodes to which a driving pulse is applied. Application of the driving pulse to the above electrodes causes shear deformation of the above piezoelectric actuator, whereby the pressure inside the above pressure chamber changes to result in ejection of liquid droplets from the above nozzle which is formed at one end of the above pressure chamber.

In the shear mode piezoelectric actuator, since voltage is applied vertically to the polarization direction of the piezoelectric actuator, depolarization may occur when a high electric filed comparable to the coercive field is applied. As a result, displacement property may be largely decreased. Therefore, when the piezoelectric ceramic composition having a low coercive field is used for a shear mode piezoelectric actuator, it is required to make the thickness of the shear mode piezoelectric actuator to which is applied voltage beyond the predetermined value. When the thickness of the dividing wall is thick, a resonance frequency will become low and the driving frequency will fall. Moreover, when the thickness of the dividing wall is thick, displacement efficiency will fall. In addition, when the shear mode piezoelectric actuator is used for a dividing wall of a liquid passage, the thickness of the dividing wall to which is applied an electric field must be set to be beyond the predetermined value, as a result, a nozzle density cannot be raised.

The piezoelectric ceramic composition of the present invention has a high coercive electric field, as shown in the embodiment mentioned later. By this, if the droplet ejection head equipped with the shear mode type piezoelectric actuator using the aforesaid piezoelectric ceramic composition is used, the driving voltage impressed to this shear mode type piezoelectric actuator will be made to increase, and the amount of the maximum displacement can be enlarged. Moreover, since the thickness of the shear mode type piezoelectric actuator can be made thin, the resonance frequency of an actuator is raised to result in achieving a high frequency drive. In addition, since the thickness of the shear mode type piezoelectric actuator can be made thin, displacement efficiency also improves. Furthermore, when the shear mode piezoelectric actuator is used for a dividing wall of a liquid passage, since only the thickness of the dividing wall can be made thin, it becomes possible to make small the nozzle pitch P (refer to FIG. 2(a)), and to raise a nozzle density.

The Second Embodiment

Hereinafter, the second embodiment of the liquid droplet ejection head of the present invention, in which the above piezoelectric ceramic composition is employed as a push type piezoelectric actuator utilizing a piezoelectric $d_{31}$ constant, is described with reference to FIG. 4.

Figure 4:
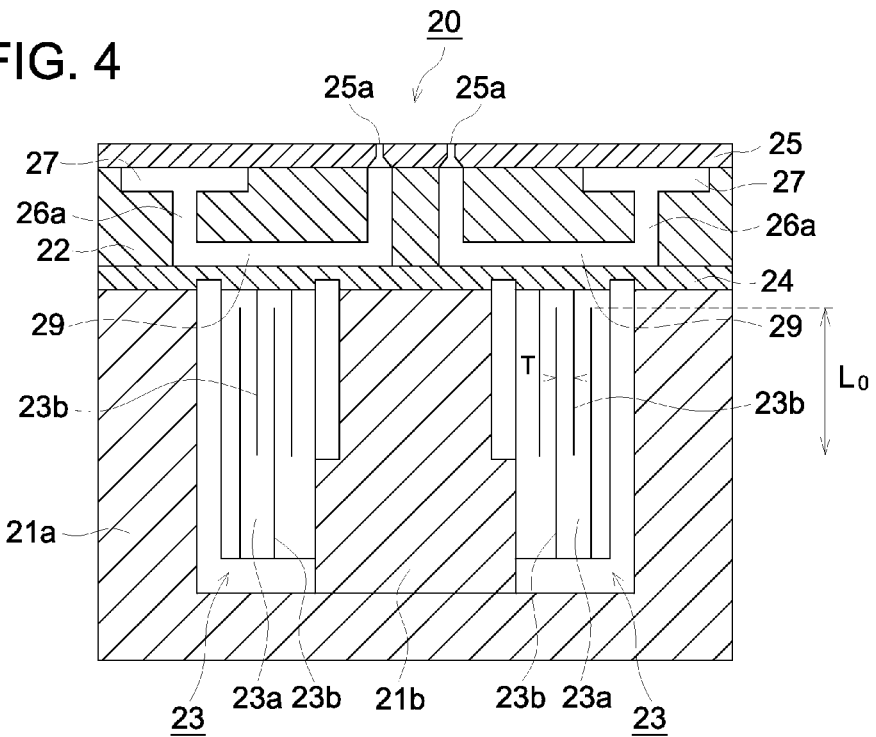
FIG. 4 is a diagram illustrating a constitution of the liquid droplet ejection heads of the second embodiment of the present invention.

FIG. 4 is a schematic cross-sectional diagram of a liquid droplet ejection head of a type such that the volume of a pressure chamber is altered by deformation due to expansion and contraction of a piezoelectric actuator which is provided on a wall of a pressure chamber.

At one end of base 21b, which is in a lower part of the figure, formed is a protruding portion at one side of the base, which portion fixes laminated body 23 comprising piezoelectric actuator 23a and electrode 23b (hereinafter described as laminated body 23) which will be described later. At the surface of an upper end of base 21b, fixed is vibrating plate 24 which separates pressure chamber 29 from laminated body 23.

Vibrating plate 24 is formed so as to readily respond to vibration of laminated body 23 by forming concave portions near places which make close contacts with laminated body 23. On the surface of vibrating body 23, fixed are a pressure chamber forming member as well as spacer member 22, which also functions as a supply board having liquid introducing port 26a. The area facing laminated body 23 is constituted to form a pressure chamber in conjunction with vibrating plate 24. Further, liquid introducing port 26a is formed, though it is not illustrated, such that the pressure chamber becomes narrower in the direction of pressure chamber 29 to restrict liquid flow.

On the surface of spacer member 22, fixed is nozzle plate 25, and there are provided a plurality of nozzle orifices coordinating with an array form of laminated body 23 in which each of piezoelectric actuators 23a and electrodes 23b is alternatively laminated in a layer form. Further, in a liquid supply section, liquid supply part 27 is formed in such a manner that opening parts, where nozzle orifices 25a in nozzle plate 25 are not provided, are sealed.

One end of laminated body 23 is fixed onto vibrating plate 24 in such a state that each of piezoelectric actuators 23a comprising above-described piezoelectric ceramic composition, which is molded in a sheet form and sintered to allow it to be polarized in a thickness direction, and electrodes 23b are alternatively laminated in a layer form, and the side part of the other end is fixed to the protruding portion of base 21b. The lower end of base 21b is fixed to fixing member 21a. Fixing member 21a supports vibrating plate 24, spacer member 22, and nozzle plate 25, and, through base 21b, brings an unfixed end of laminated body 23 (an upper end in the figure) into contact with vibrating plate 24. Further, as the figure clearly shows, base 21b is constituted such that one end of base 21b almost meets to a surface at an end of the unfixed end of laminated body 23, and the size of the other end of base 21b is such that it protrudes farther than the fixed end of laminated body 23. In liquid droplet ejection head exhibiting the above structure, when a voltage is applied between electrode 23b and electrode 23b located at both surfaces of each piezoelectric actuator 23a, laminated body 23 is stretched to the axial direction perpendicular in the electric field direction, and then, vibrating plate 24 which is fixed to the end of laminated body 23 is stretched and displaced in the direction of nozzle plate 25 to result in pressurizing pressure chamber 29. The liquid, which is subjected to a higher pressure due to decrease in volume of above pressure chamber 29, is ejected from nozzle orifice 25a as liquid droplets. At that time, the amount of displacement Δ of laminated body 23 is represented by the formula below.

$$\Delta = (\text{piezoelectric } d_{15} \text{ constant}) \times L0 \times V/T,$$

wherein, as shown in FIG. 4, L0 is the length of the active part, V is a driving pulse voltage, and T is the thickness of piezoelectric actuator 23a.

Supply of liquid from a liquid storage tank to a nozzle after liquid droplets have been ejected is carried out through a liquid supply port and pressure chamber 4 by force of capillary action of the nozzle.

Piezoelectric actuator 23a in the liquid droplet ejection head employs a piezoelectric ceramic composition represented by the following formula:

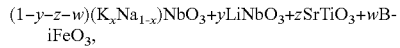

$$(1-y-z-w)(K_xNa_{1-x})NbO_3 + yLiNbO_3 + zSrTiO_3 + wBiFeO_3,$$

provided that $0.4 < x < 0.6$, $0 < y \leq 0.1$, $0 < z < 0.1$, $0 < w < 0.09$, and $0.03 < y+z+w \leq 0.12$, wherein $(K_xNa_{1-x})NbO_3$ represents potassium sodium niobate, $LiNbO_3$ represents lithium niobate, $SrTiO_3$ represents strontium titanate and $BiFeO_3$ represents bismuth iron oxide.

By employing a piezoelectric ceramic composition exhibiting a high piezoelectric $d_{31}$ constant and having no second order phase transition at around room temperature (from 10° C. to 40° C.) such as described in the present embodiments as a piezoelectric actuator, the followings can be achieved. It is possible to obtain an enough amount of displacement which is required to eject an ink droplet with a driving voltage applicable to practical use. And at the same time, a change of displacement properties of the piezoelectric actuator is small even if temperature change takes place in the using temperature range near room temperature, and liquid ejection properties are stabilized.

Since the above piezoelectric ceramic composition contains no lead in its composition, toxic lead is not eluted off from the waste thereof. Therefore, the above piezoelectric ceramic composition can be one which contains no lead and exhibits high safety.

In the present embodiment, exemplified is a liquid droplet ejection head, in which the piezoelectric ceramic composition is employed as a push type piezoelectric actuator utilizing a piezoelectric $d_{31}$ constant, but the piezoelectric ceramic composition is not limited thereto. It can also be applied to a liquid droplet ejection head which is a deformation example of the second embodiment shown below.

Below, a deformation example of the second embodiment of the liquid droplet ejection head of the present embodiment employing the above piezoelectric ceramic composition as a push type piezoelectric actuator utilizing a piezoelectric $d_{33}$ constant will be described with reference to FIG. 5.

Figure 5:
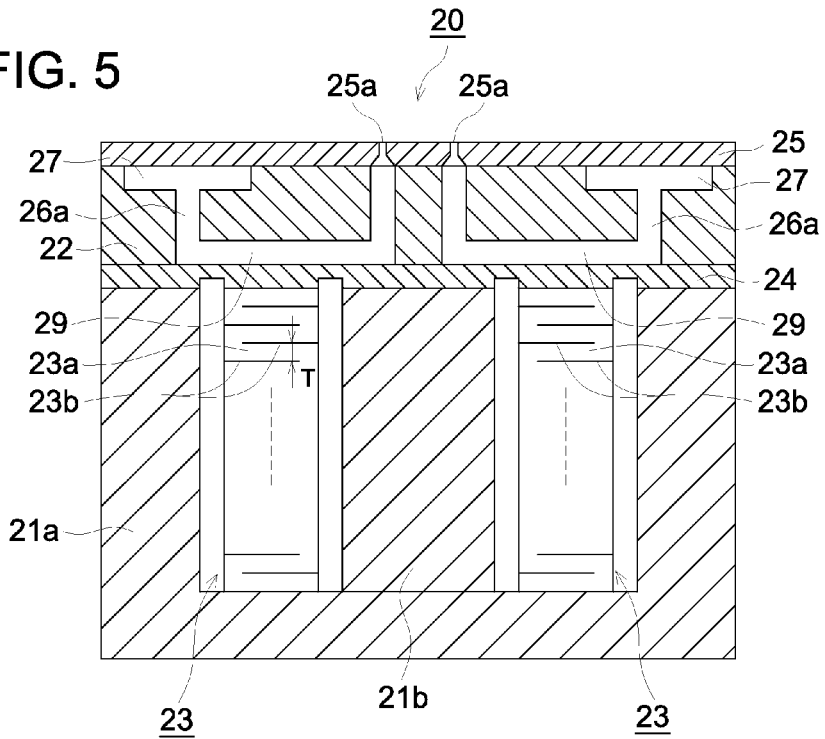
FIG. 5 is a diagram illustrating a deformation example of a constitution of the liquid droplet ejection heads of the second embodiment of the present invention.

In FIG. 5, with regard to the members exhibiting the same functions as the liquid droplet ejection head of the second embodiment in FIG. 4, the same symbols are used, and their detailed descriptions will be omitted. In the present deformation example, piezoelectric actuator 23a and electrode 23b are laminated along the length of laminated body 23, and one end of the longitudinal direction is secured to fixing member 21a. When a voltage is applied between electrode 23b and electrode 23b located on both surfaces of each piezoelectric actuator 23a, laminated body 23 is stretched in the electric field direction, and then, vibrating plate 24, which is fixed to one end of laminated body 23, is stretched and displaced toward the direction of nozzle plate 25, to result in compression of pressure chamber 29. The liquid, which is pressurized due to a decrease in volume of above pressure chamber 29, is ejected from nozzle orifice 25a as liquid droplets.

The Third Embodiment

Hereinafter, the third embodiment of the liquid droplet ejection head of the present invention, in which the above piezoelectric ceramic compositions is employed as a deflection type piezoelectric actuator utilizing a piezoelectric $d_{31}$ constant, will be described with reference to FIG. 6.

Figure 6:
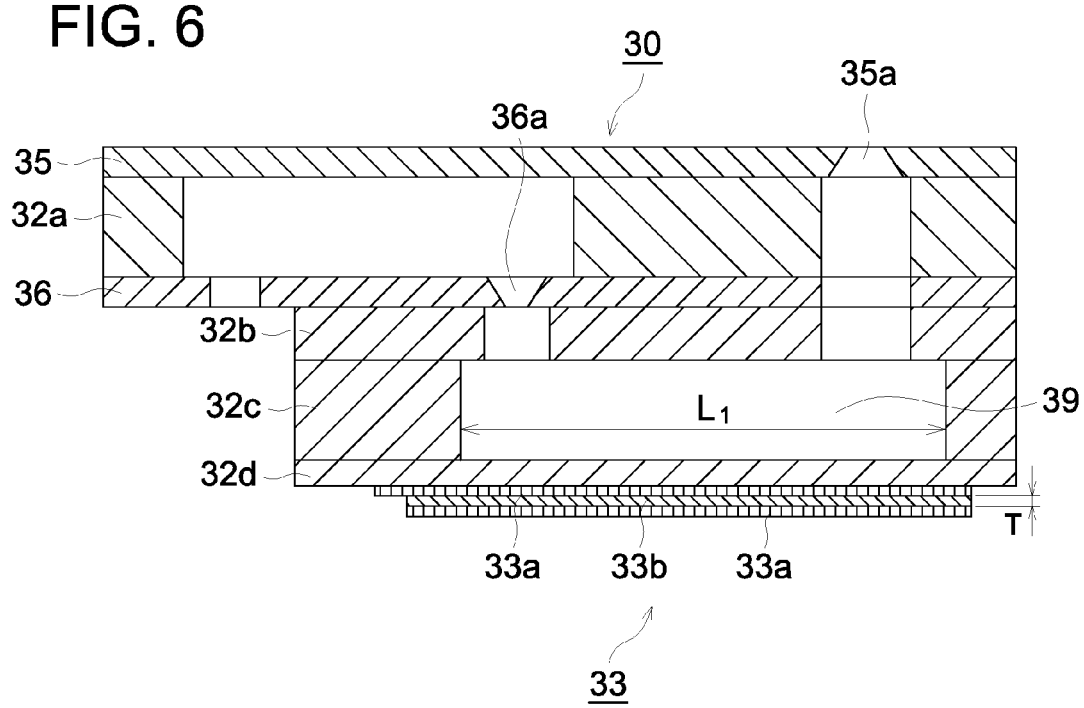
FIG. 6 is a diagram illustrating a constitution of the liquid droplet ejection head of the third embodiment of the present invention.
Figure 7:
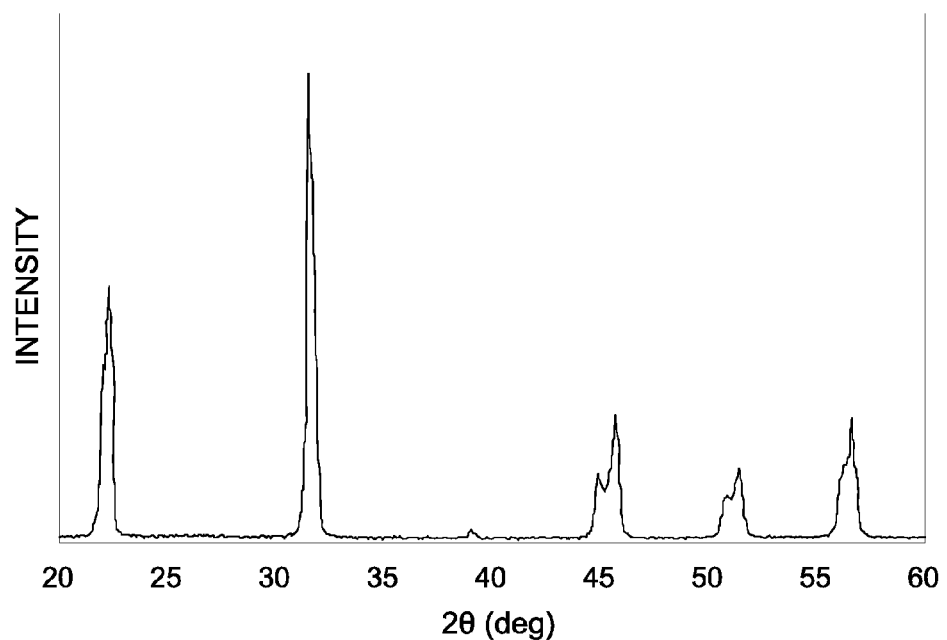
FIG. 7 is an X ray diffraction diagram of Sample No. 8 of the present invention.
Figure 8:
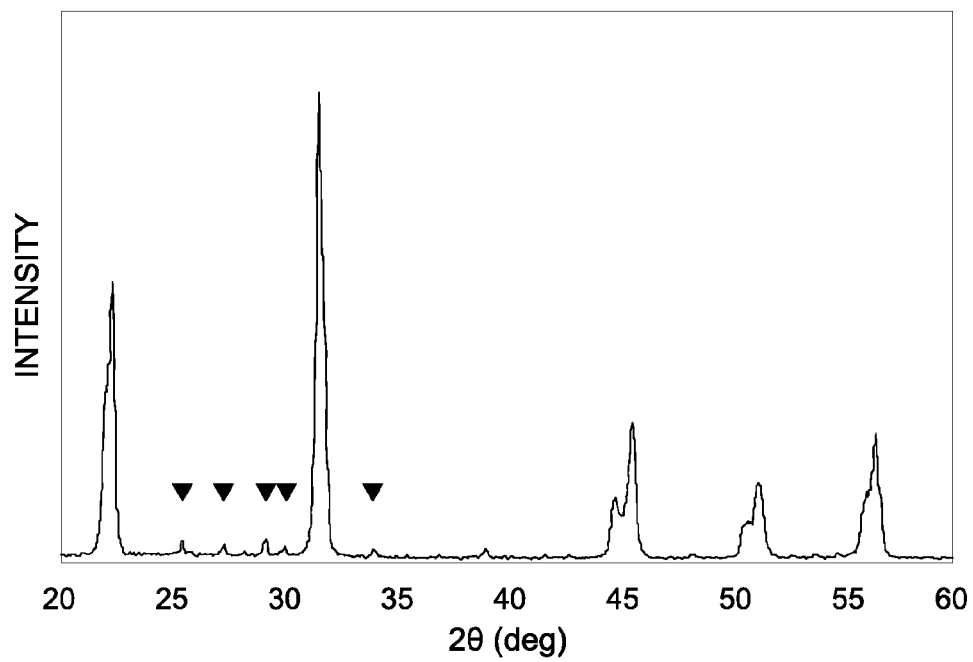
FIG. 8 is an X ray diffraction diagram of Sample No. 16 as a comparative example.
Figure 9:
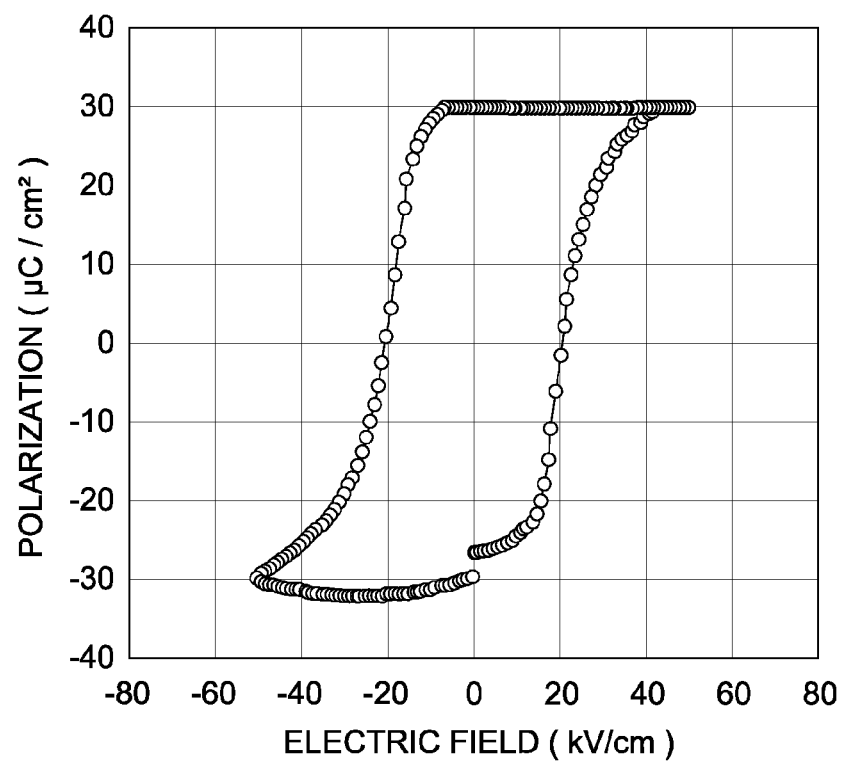
FIG. 9 is a graph showing a P-E hysteresis characteristic of Sample No. 8 of the present invention.
Figure 10:
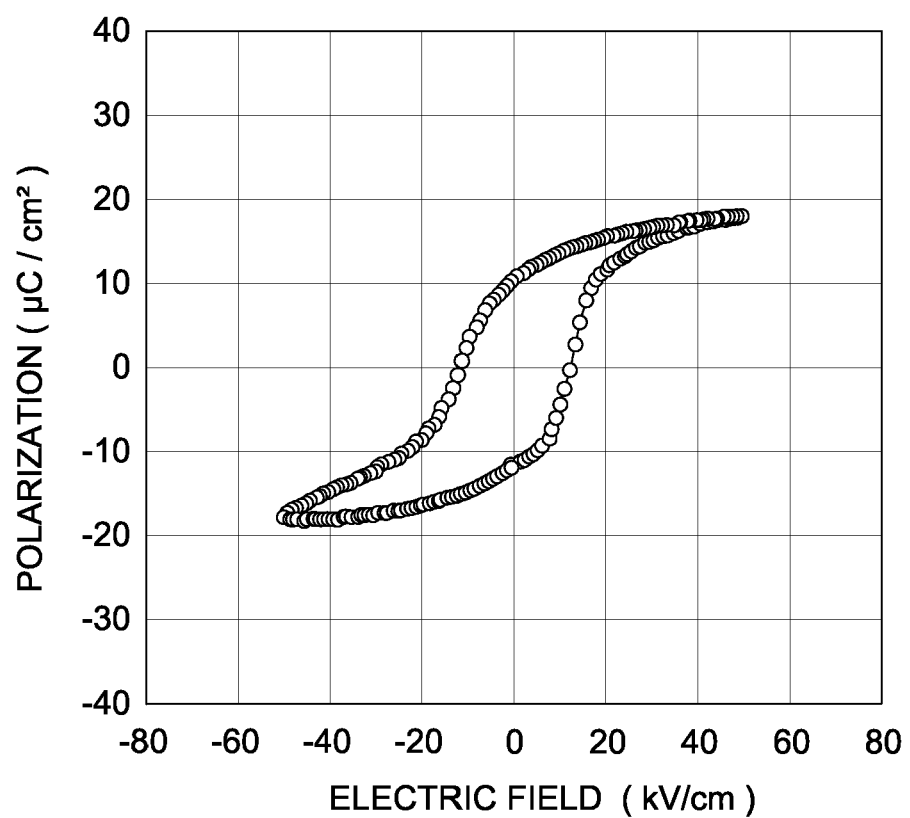
FIG. 10 is a graph showing a P-E hysteresis characteristic of Sample No. 1 as a comparative example.

FIG. 6 is a schematic cross-sectional diagram of a liquid droplet ejection head of a type similar to the second embodiment in which the volume of a pressure chamber is altered by deformation due to expansion and contraction of a piezoelectric actuator which is provided on a wall of a pressure chamber, but it's structure differs from that of the second embodiment.

As a specific example, for example, the above liquid droplet ejection head is formed in such a manner that metallic nozzle plate 35, in which a plurality of nozzle orifices 35a are formed, and metallic supply plate 36, which is a member being provided on the liquid introduction side of pressure chamber 39 to restrict liquid flow and in which plate a plurality of liquid introduction ports 36a are provided. The metallic nozzle plates 35 and metallic supply plate 36 sandwich flow channel plate 32a between them and these plates were adhered to each other, whereby a liquid pressure chamber, which introduces liquid into above nozzle orifice 35a, and a liquid supply flow channel, which introduces liquid into above liquid introduction port 36a, are separately formed inside the head; and further, a member, which is formed by a laminated body of plates 32b, 32c, and 32d, made of metal or synthetic resin, and having a plurality of openings corresponding to each above nozzle orifice 35a and liquid introducing port 36a, is laminated onto the above structure, which are then bonded to form an integrated structure, whereby pressure chambers 39 are formed behind each of above nozzle orifice 35a and liquid introducing port 36a; and in addition, laminated body 33 is firmly fixed on a wall part of pressure chamber 39, which laminated body 33 is composed of lower electrode 33a, piezoelectric actuator 33b, which is made of above piezoelectric ceramic composition which was molded in a sheet form and sintered to allow it to be polarized in its thickness direction, and upper electrode 33a.

Liquid droplet ejection head 30 is structured so that liquid supplied to pressure chamber 39 is ejected through nozzle orifice 35a which is formed in nozzle plate 35. More specifically, droplet ejection head 30 is structured such that nozzle plate 35 and supply plate 36, which is a member exhibiting an opening at the liquid introducing side of the pressure chamber and restricting liquid flow, are laminated with flow channel plate 32a being sandwiched between them, and bonded by adhesives to form an integrated structure.

A plurality of nozzle orifices 35a (not illustrated) for liquid ejection are formed in nozzle plate 35, as well as passing-through holes in the board thickness direction are formed in supply plate 36 and flow channel plate 32a at places corresponding to each of nozzle orifices 35a featuring a cavity being larger by a predetermined amount than that of the aforesaid nozzle orifice 35a.

In supply plate 36, a plurality of liquid introducing ports 36a (orifice holes) are formed, and window parts, which are provided at flow channel plate 32a, are covered with nozzle plate 35 and supply plate 36 from the both sides of the window, whereby a liquid supply flow channel, which is connected to each liquid introducing port 36a, is formed between above nozzle plate 35 and supply plate 36. Further, supply plate 36 is provided with a supply port which supplies liquid to a liquid supply flow channel, which liquid is introduced from a liquid storage tank.

In general, it is preferable that plastics or metals such as nickel and stainless steel are employed to form each of plates 35, 36 and 32a with a high dimensional accuracy. Liquid introducing port 36a is preferably formed as a tapered shape, as is illustrated in the figure, whose diameter decreases along the direction of liquid flow.

On the other hand, on the opposite side of supply plate 36, a structure such that closing plate 32d and connecting plate 32d are laminated with spacer plate 32c being sandwiched between them is formed in an integrated fashion.

Within connecting plate 32b, each of the connecting openings is formed at places corresponding to a hole and liquid introducing port 36a, both of which are formed in supply plate 36.

Within spacer plate 32c, a plurality of longitudinal rectangular window parts are formed. For each window part, spacer plate 32c is laminated to connecting plate 32b so that each of connecting openings provided in connecting plate 32b will feature an opening.

On the surface of above spacer plate 32c opposing to the side where connecting plate 32b is laminated, closing plate 32d is laminated, and the opening of the window part is covered with above closing plate 32d, whereby pressure chamber 39 is formed so that liquid is connected to the exterior through each of the connecting openings.

Closing plate 32d, spacer plate 32c, and connecting plate 32b are preferably constituted of ceramic. For aforesaid ceramic materials, alumina or zirconia are preferably employed in terms of formability. The thickness of closing plate 32d is preferably 50 μm or less, more preferably about 3 to 12 μm. The thickness of connecting plate 32b is preferably 10 μm or more, more preferably 50 μm or more. The thickness of spacer plate 32c is preferably 50 μm or more, more preferably 100 μm or more.

Pressure chamber 39 thus formed is typically formed as an integrated sintered product of ceramics, but it may be made by bonding the respective plates employing adhesives.

Each of the portions on the exterior surface of closing plate 32d corresponding to pressure chambers 39 for each liquid is provided with laminated bodies 33. The laminated body 33, which is composed of lower part electrode 33a, piezoelectric actuator 33b, and upper part electrode 33a, is firmly fixed to closing plate 32d.

In this case, for closing plate 32d, a ceramic plate made of zirconium oxide as a primary component is preferably employed.

By incorporating, via addition, one compound of yttrium oxide, cerium oxide, magnesium oxide, and calcium oxide, or a combination thereof, into zirconium oxide, the zirconium oxide is partially or wholly stabilized. The incorporating amount by addition of each compound into zirconium oxide is preferably from 2 to 7 mol % of yttrium oxide, from 6 to 15 mol % of cerium oxide, and from 5 to 12 mol % of magnesium oxide or calcium oxide. Of these, it is particularly preferable to employ yttrium oxide as a partial stabilizer, and in which case, it is desirable to add from 2 to 7 mol %, more preferably from 2 to 4 mol %. The zirconium oxide, in which yttrium oxide is added and incorporated in an amount of the above range, is partially stabilized in a crystal whose major crystalline phase is tetragonal, or in a mixed crystal comprised mainly of cubic and tetragonal resulting in excellent base characteristics.

Materials for electrode films 33a and 33a are not particularly limited as long as they are conductors which can withstand an oxidation atmosphere of a high degree of thermal treatment temperature or sintering temperature, and they may be a metal element or an alloy, or may be a mixture of ceramics or glass with a metal or an alloy, or further, they may be conductive ceramics. Preferably employed are electrode materials whose primary components are precious metals such as platinum, palladium, and rhodium which exhibit a high melting point or alloys such as silver/palladium, silver/platinum, or platinum/palladium.

Closing plate 32d, spacer plate 32c and connecting plate 32b are provided with laminated body 33, and the aforesaid connecting plate 32b, as illustrated in FIG. 6, is laminated to supply plate 36 to form an integrated structure employing adhesives.

Liquid droplet ejection head 30 is formed in such a manner that via an operation of piezoelectric actuator 33b on closing plate 32d, serving as a vibrating plate, liquid which is introduced through a liquid supply flow channel is supplied from liquid introducing port 36a into pressure chamber 39, so that the liquid passes a hole and is ejected from nozzle orifice 35a.

Piezoelectric actuator 33b, which is laminated to closing plate 32d, serving as a vibrating plate, is polarized in the thickness direction. Application of voltage, between upper part electrode 33a and lower part electrode 33a, both of which are arranged above and below each other, shrinks piezoelectric actuator 33b in the longitudinal direction (that is, in L1 direction in FIG. 6), whereby closing plate 32d and piezoelectric actuator 33b cause a bending deformation, as is a bimetal, which alters the volume of pressure chamber 39, resulting in ejected liquid droplets from nozzle orifice 35a. The amount of displacement Δ of piezoelectric actuator 33b, at the time of ejection, is represented by the formula below.

$$\Delta = (\text{piezoelectric } d_{31} \text{ constant}) \times L1 \times V/T,$$

wherein, as shown in FIG. 4, L1 is the length of pressure chamber 39, V is a driving pulse voltage, and T is the thickness of piezoelectric actuator 33b.

Supply of liquid, from a liquid storage tank to a nozzle after liquid droplets have been ejected, is carried out through a liquid supply port and pressure chamber 39 due to a force of capillary action of the nozzle.

Piezoelectric actuator 33b in the liquid droplet ejection head employs piezoelectric ceramic composition represented by the following formula:

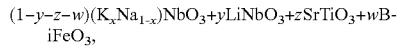

$(1-y-z-w)(K_xNa_{1-x})NbO_3+yLiNbO_3+zSrTiO_3+wBiFeO_3$, provided that $0.4<x<0.6$, $0<y\leq0.1$, $0<z<0.1$, $0<w<0.09$, and $0.03<y+z+w\leq0.12$, wherein $(K_xNa_{1-x})NbO_3$ represents potassium sodium niobate, $LiNbO_3$ represents lithium niobate, $SrTiO_3$ represents strontium titanate and $BiFeO_3$ represents bismuth iron oxide.

By employing a piezoelectric ceramic composition exhibiting a high piezoelectric $d_{31}$ constant and having no second order phase transition at around room temperature (from 10° C. to 40° C.) such as described in the present embodiments as a piezoelectric actuator, the followings can be achieved. It is possible to obtain an enough amount of displacement which is required to eject an ink droplet with a driving voltage applicable to practical use. And at the same time, a change of displacement properties of the piezoelectric actuator is small even if temperature change takes place in the using temperature range near room temperature, and liquid ejection properties are stabilized.

Since the above piezoelectric ceramic composition contains no lead in its composition, toxic lead does not eluted off from the waste thereof. Therefore, the above piezoelectric ceramic composition can be one which contains no lead and exhibits high safety.

The liquid droplet ejection head of the present invention can be widely utilized for not only inkjet heads which are employed for inkjet printers, but industrial applications such as creations of electronic circuits, production of color filters for liquid crystal displays, and production of organic EL displays.

EXAMPLE

Hereinafter, the piezoelectric ceramic compositions relating to examples of the present invention are produced, and the characteristics thereof were evaluated.

The method for the production is described in detail below.

As raw materials of the piezoelectric ceramic composition, extremely pure $Li_2CO_3$, $Na_2CO_3$, $K_2CO_3$, $SrCO_3$, $Nb_2O_5$, $TiO_2$, $Fe_2O_3$ and $Bi_2O_3$ at a purity of at least 99% were prepared. These raw materials were fully dried, and then the amounts of the raw materials were measured as are shown in Table 1 so that the piezoelectric ceramic compositions having the formula of $(1-y-z-w)(K_xNa_{1-x})NbO_3+yLiNbO_3+zSrTiO_3+wBiFeO_3$ were produced.

The compounded raw materials were blended via a ball mill in anhydrous acetone for 24 hours, and then dried to produce a mixture.

Next, the aforesaid mixture was calcined at 700 to 900° C. for 3 hours, which mixture was then subjected to pulverization via a ball mill for 24 hours. The pulverized mixture was dried to produce a calcined powder of the component.

Subsequently, polyvinyl butyral as a binder was added to the calcined powder, and then the mixture was granulated and subjected to pressure molding. The pressure molding was carried out in such a manner that the granulated substance, made of the pulverized substance, was molded in the form of pellets via uniaxial pressing, and then the resultant pellets were re-molded via a cold isostatic press (CIP) at a pressure of 1 ton/cm².

The molded material thus produced were sintered at 1,000-1,200° C. in the atmosphere for 3 hours to produce a sintering product.

Further, the crystalline phase of the resulted sintered substance was identified via powdered X-ray diffraction (XRD) analysis. As shown in FIG. 1, the sintered substance of the present invention was confirmed to have a perovskite single-phase structure from the diffraction peak. As shown in FIG. 2, the comparative sample No. 16 was confirmed to have different phases (shown by ▼ in FIG. 2) and a perovskite single-phase structure was not obtained.

The produced samples were subjected to a bulk density measurement using an Archimedes method. A relative density was calculated from a theoretical density ratio. The sintered samples were evaluated as follows: a relative density of less than 80% was classed to be sintered with remarkable defects (C); a relative density of from 80% to less than 90% was classed to be sintered with slight defects (B); and a relative density of 90% or more was classed to be sintered without defects.

The obtained sintered product was cut to a predetermined size, which was then subjected to a parallel grinding then gold electrodes were formed via sputtering on both sides thereof. Subsequently, in silicone oil at about from 100° C., direct current voltage of from 2 to 7 kV/mm was applied for 10 minutes between the electrodes to produce a piezoelectric ceramic composition polarized in the thickness direction.

The obtained piezoelectric ceramic composition was subjected the measurements to obtain the followings: piezoelectric $d_{33}$ constant, presence or absence of the second order phase transition near room temperature (from 10° C. to 40° C.), Curie temperature Tc, relative dielectric constant $\in_r$, P-E hysteresis characteristic, remanent polarization Pr, and coercive field Ec.

The piezoelectric $d_{33}$ constant was determined via a resonance-anti-resonance method at 25° C. employing an impedance analyzer (type 4294A: manufactured by Agilent Technologies Inc.).

The presence or absence of the second order phase transition near room temperature and Curie temperature Tc were obtained by measuring a temperature dependency of the relative dielectric constant $\in_r$ in the temperature range of −30° C. to +500° C. Specifically, employing an impedance analyzer (type 4294A: manufactured by Agilent Technologies Inc.) and a thermostat bath, after the sample was held for a predetermined time at every 2° C. to 5° C. interval in the range of from −30° C. to +500° C., the relative dielectric constant $\in_r$ was measure with a measuring frequency of 100 kHz at each temperature. The presence or absence of the second order phase transition was determined by the presence or absence of discontinuity of the relative dielectric constant $\in_r$ near room temperature based on the following criteria. The presence of the second order phase transition near mom temperature was designated as "not good"; and the absence of the second order phase transition near room temperature was designated as "good". Curie temperature Tc was taken as a temperature at which the relative dielectric constant $\in_r$ exhibited its highest value.

The P-E hysteresis characteristics were determined by applying voltage of 5 kV at 25° C. using the Evaluation System of Characteristics of Ferroelectric Substance (a product of Radiant Technologies Inc.). The measurement result of Sample No. 8 of the present invention is shown in FIG. 3, and the measurement result of Comparative sample No. 1 is shown in FIG. 4. As is seen from FIG. 3, the piezoelectric ceramic composition of the present embodiment provides good square-shaped hysteresis loops, leading to a preferred large remanent polarization (Pr)(μC/cm$^2$). The term "remanent polarization" refers to a magnitude of polarization when the electric field is reversed, that is, when applied electric field intensity becomes 0 kV/cm. In FIG. 3, "remanent polarization" corresponds to an amount of polarization at an intersection point of the hysteresis loop with the Y axis (the line at 0 kV/cm of the electrical field intensity).

The coercive field Ec was determined as a value of electric field when the amount of polarization is zero in the P-E hysteresis loop obtained from the measurement of P-E hysteresis characteristic.

In Table 1, there are shown data of the prepared piezoelectric ceramic compositions as: constitution; piezoelectric $d_{33}$ constant; presence or absence of the second order phase transition near room temperature; Curie temperature Tc; relative dielectric constant $\in_r$; sintering characteristic; remanent polarization Pr, and coercive field Ec. Since Sample No. 2, 11, 21 and 25 each produced sintering defect, and since Sample No. 17 exhibited the second order phase transition near room temperature, as a result, they were not able to be evaluated. In addition, since Sample No. 16, 18 and 22 each showed very small piezoelectric $d_{33}$ constant, therefore, evaluations of presence or absence of the second order phase transition near room temperature and Curie temperature Tc were suspended.

further, it was possible to obtain the sintered material having good sintering characteristic with high density.

On the other hand, among the samples which did not satisfy the condition of 0.4<x<0.6, Sample No. 22 having x of less than 0.4 exhibited the piezoelectric $d_{33}$ constant of 62 (pC/N), and it was not possible to achieve the piezoelectric $d_{33}$ constant of 120 (pC/N) or more. Moreover, Sample No. 25 having x of larger than 0.6 produced sintering defect.

Among the samples which did not satisfy the condition of 0<y≦0.1, Sample No. 2 having y of 0 produced sintering defect. And Sample No. 16 having y of larger than 0.1 produced a different phase to result in exhibiting the piezoelectric $d_{33}$ constant of 90 (pC/N), and it was not possible to achieve the piezoelectric $d_{33}$ constant of 120 (pC/N) or more.

Among the samples which did not satisfy the condition of: 0<z<0.1, Sample No. 17 having z of 0 exhibited a second order phase transition near room temperature, and it was not possible to achieve the piezoelectric ceramic composition without having a second order phase transition near room temperature. And Sample No. 18 having z of larger than 0.1 exhibited the piezoelectric $d_{33}$ constant of 6 (pC/N), and it was not possible to achieve the piezoelectric $d_{33}$ constant of 120 (pC/N) or more.

Among the samples which did not satisfy the condition of: 0<w<0.09, Sample No. 1 having w of 0 exhibited the piezoelectric $d_{33}$ constant of 67 (pC/N), and it was not possible to achieve the piezoelectric $d_{33}$ constant of 120 (pC/N) or more. Moreover, Sample No. 21 having w of larger than 0.09 produced sintering defect.

TABLE 1

|  | Sample No. | Constitution | | | | Evaluation results | | | | | | |
| --- | --- | --- | --- | --- | --- | --- | --- | --- | --- | --- | --- | --- |
|  |  | x | y | z | w | Pr(μC/cm$^2$) | Ec(kV/cm) | d33(pC/N) | εr | Tc(° C.) | Second order phase transition | Sintering characteristic |
| Comparison | 1 | 0.5 | 0.04 | 0.01 | 0 | 10.2 | 12.1 | 67 | 537 | 409 | Good | Good |
| Comparison | 2 | 0.5 | 0 | 0.005 | 0.005 | — | — | — | — | — | — | Not good |
| Invention | 3 | 0.5 | 0.025 | 0.005 | 0.005 | 16.6 | 15.6 | 148 | 674 | 400 | Good | Good |
| Invention | 4 | 0.5 | 0.03 | 0.005 | 0.005 | 15.3 | 15.6 | 130 | 342 | 402 | Good | Good |
| Invention | 5 | 0.5 | 0.035 | 0.005 | 0.005 | 17.1 | 15.7 | 140 | 669 | 412 | Good | Good |
| Invention | 6 | 0.5 | 0.04 | 0.005 | 0.005 | 19.6 | 23.8 | 147 | 697 | 412 | Good | Good |
| Invention | 7 | 0.5 | 0.045 | 0.005 | 0.005 | 15.5 | 18.2 | 150 | 788 | 420 | Good | Good |
| Invention | 8 | 0.5 | 0.05 | 0.005 | 0.005 | 29.8 | 20.2 | 230 | 453 | 446 | Good | Good |
| Invention | 9 | 0.5 | 0.055 | 0.005 | 0.005 | 16.3 | 17.8 | 182 | 715 | 449 | Good | Good |
| Invention | 10 | 0.5 | 0.06 | 0.005 | 0.005 | 13.8 | 22.5 | 150 | 1043 | 453 | Good | Good |
| Comparison | 11 | 0.5 | 0.01 | 0.01 | 0.005 | — | — | — | — | — | — | Not good |
| Invention | 12 | 0.5 | 0.03 | 0.01 | 0.005 | 17.5 | 16.6 | 154 | 998 | 412 | Good | Good |
| Invention | 13 | 0.5 | 0.035 | 0.01 | 0.005 | 24.8 | 20.4 | 124 | 984 | 412 | Good | Good |
| Invention | 14 | 0.5 | 0.04 | 0.01 | 0.005 | 17.6 | 19.0 | 133 | 969 | 409 | Good | Good |
| Invention | 15 | 0.5 | 0.045 | 0.01 | 0.005 | 15.6 | 17.8 | 139 | 923 | 406 | Good | Good |
| Comparison | 16 | 0.5 | 0.11 | 0.01 | 0.005 | 2.87 | 12.4 | 90 | 731 | — | — | Good |
| Comparison | 17 | 0.5 | 0.035 | 0 | 0.005 | — | — | — | — | — | Not good | Good |
| Comparison | 18 | 0.5 | 0.02 | 0.1 | 0.005 | 1.34 | 8.1 | 6 | 953 | — | — | Good |
| Invention | 19 | 0.5 | 0.05 | 0.005 | 0.002 | 28.2 | 16.5 | 200 | 358 | 438 | Good | Good |
| Invention | 20 | 0.5 | 0.05 | 0.005 | 0.01 | 27.3 | 18.2 | 218 | 436 | 430 | Good | Good |
| Comparison | 21 | 0.5 | 0.05 | 0.005 | 0.09 | — | — | — | — | — | — | Not good |
| Comparison | 22 | 0.4 | 0.05 | 0.005 | 0.005 | 9.7 | 12.2 | 62 | 521 | — | — | Good |
| Invention | 23 | 0.45 | 0.05 | 0.005 | 0.005 | 13.3 | 16.5 | 164 | 835 | 449 | Good | Good |
| Invention | 24 | 0.55 | 0.05 | 0.005 | 0.005 | 11.3 | 16.3 | 160 | 810 | 432 | Good | Good |
| Comparison | 25 | 0.6 | 0.05 | 0.005 | 0.005 | — | — | — | — | — | — | Not good |

In Table 1, Comparative samples are outside the range of the present invention. In Table 1, the samples which satisfy all of the requirements of: 0.4<x<0.6, 0<y≦0.1, 0<z<0.1, 0<w<0.09, and 0.03<y+z+w≦0.12, exhibited excellent results. As are shown in Table 1, all of them exhibited larger piezoelectric $d_{33}$ constant than the conventionally known $KNbO_3$—$NaNbO_3$ piezoelectric ceramic composition, each sample showed larger than 120 (pC/N); they did not have the second order phase transition near room temperature; and Among the samples which did not satisfy the condition of: 0.03<y+z+w≦0.12, Sample No. 2 and Sample No. 11 each having y+z+w of less than 0.03, produced sintering defect. Moreover, Sample No. 16 and Sample No. 18 each having y+z+w of larger than 0.12, exhibited the piezoelectric $d_{33}$ constant of 90 (pC/N), and it was not possible to achieve the piezoelectric $d_{33}$ constant of 120 (pC/N) or more.

In the present examples, evaluation results of the piezoelectric $d_{33}$ constant were shown as a piezoelectric constant.

However, the similar evaluations were carried out based on the piezoelectric $d_{15}$ constant and the piezoelectric $d_{31}$ constant. It was confirmed that the similar effects can be obtained.

The invention claimed is:

1. A liquid droplet ejection head comprising:
a piezoelectric actuator using a piezoelectric ceramic composition represented by the following formula:

$$(1-y-z-w)(K_xNa_{1-x})NbO_3+yLiNbO_3+zSrTiO_3+wBiFeO_3,$$

provided that $0.4<x<0.6$, $0<y\leq0.1$, $0<z<0.1$, $0<w<0.09$, and $0.03<y+z+w\leq0.12$,
wherein $(K_xNa_{1-x})NbO_3$ represents potassium sodium niobate, $LiNbO_3$ represents lithium niobate, $SrTiO_3$ represents strontium titanate and $BiFeO_3$ represents bismuth iron oxide, and
the piezoelectric ceramic composition has a piezoelectric $d_{33}$ constant of 120 (pC/N) or more.

2. The liquid droplet ejection head of claim 1,
wherein the piezoelectric actuator is a shear mode piezoelectric actuator utilizing a piezoelectric $d_{15}$ constant.

3. The liquid droplet ejection head of claim 1,
wherein the piezoelectric actuator is a deflection piezoelectric actuator utilizing a piezoelectric $d_{31}$ constant.

4. The liquid droplet ejection head of claim 1,
wherein the piezoelectric actuator is a push piezoelectric actuator utilizing a piezoelectric $d_{31}$ constant.

5. The liquid droplet election head of claim 1,
wherein the piezoelectric actuator is a push piezoelectric actuator utilizing a piezoelectric $d_{33}$ constant.

* * * * *